(12) United States Patent
Huang et al.

(10) Patent No.: US 7,738,275 B2
(45) Date of Patent: Jun. 15, 2010

(54) LEAKAGE CURRENT CUT-OFF DEVICE FOR TERNARY CONTENT ADDRESSABLE MEMORY

(75) Inventors: Po-Tsang Huang, Hsinchu (TW); Wen-Yen Liu, Hsinchu (TW); Wei Hwang, La Vema, CA (US)

(73) Assignee: National Chiao Tung University, Hsinchu (TW)

( * ) Notice: Subject to any disclaimer, the term of this patent is extended or adjusted under 35 U.S.C. 154(b) by 207 days.

(21) Appl. No.: 12/007,826

(22) Filed: Jan. 16, 2008

(65) Prior Publication Data

US 2009/0161400 A1    Jun. 25, 2009

(30) Foreign Application Priority Data

Dec. 21, 2007   (TW) .............................. 96149397 A

(51) Int. Cl.
  *G11C 7/00*   (2006.01)

(52) U.S. Cl. .................................. 365/49.17; 365/49.1
(58) Field of Classification Search ............... 365/49.17, 365/49.1
See application file for complete search history.

(56) References Cited

U.S. PATENT DOCUMENTS

| 7,145,789 B2 * | 12/2006 | Padattil | .................... 365/49.15 |
| 2006/0062038 A1 * | 3/2006 | Kang et al. | .................... 365/49 |

* cited by examiner

*Primary Examiner*—Michael T Tran
(74) *Attorney, Agent, or Firm*—Rosenberg, Klein & Lee

(57) ABSTRACT

A leakage current cut-off device for a ternary content addressable memory is provided. The storage cell of a ternary content addressable memory may be in the active mode, data-retention mode and cut-off mode. This invention applies a multi-mode data retention power gating device to the storage cell of the ternary content addressable memory to reduce the leakage current through the storage cell in the data-retention mode and the cut-off mode, and support the full speed operation in the active mode.

4 Claims, 3 Drawing Sheets

US 7,738,275 B2

LEAKAGE CURRENT CUT-OFF DEVICE FOR TERNARY CONTENT ADDRESSABLE MEMORY

BACKGROUND OF THE INVENTION

1. Field of the Invention

The present invention relates to a leakage current cut-off device for a ternary content addressable memory.

2. Description of the Prior Art

A Ternary Content Addressable Memory (TCAM) is grouped into several array segments, and each segment contains an array of TCAM cell pairs. Each TCAM cell pair is a bit and contains a storage cell and a don't-care cell. The storage value of each bit may be a "0" state, an "1" state or an "X" state that is also called don't-care state. One terminal of the storage cell connects to an electrical power source for receiving a voltage, and the other terminal connects to the ground for discharging.

A TCAM may be in read operation, write operation and search operation or standby mode. And, it is not necessary to compare the storage data of a bit with the inquiry data when "X" state is set.

The storage cell still connects to between the electrical power source and the ground via a charging terminal and a discharging terminal, respectively, and that will be accompanied by a leakage current. The leakage current consumes the electrical power and furthermore decreases the device reliability, so the leakage current must be reduced to as small as possible.

As shown in FIG. 1 for a conventional technique, n-channel metal oxide semiconductor (NMOS) field effect transistors $M_A$, $M_B$ implements the data-retention power gating technique to reduce the leakage current, wherein $M_B$ is diode connected and also called a diode-connected NMOS. When the NMOS $M_A$ is turned on and the TCAM storage cell is likely connected to the ground to support the full speed operation; and when the NMOS $M_A$ is turned off and the TCAM storage cell is connected to the ground through the NMOS $M_B$. The leakage current charges the discharging terminal of the TCAM storage cell, the virtual ground (VGND), to reach a saturated voltage via the NMOS $M_B$. Therefore, the voltage difference between the charging terminal and the discharging terminal will be decreased, and the leakage current is also reduced.

This kind of structure is good enough for the Synchronous Dynamic Random Access Memory (SDRAM), but, for the TCAM, it would not be satisfied, because "X" state is not considered. The technique of reducing the leakage current for TCAM has been developed.

SUMMARY OF THE INVENTION

In order to solve the aforementioned problem, it is an object of the present invention to provide a leakage current cut-off device for a ternary content addressable memory, TCAM, which uses a multi-mode data retention power gating device for further reducing the leakage current. The multi-mode data retention power gating device is connected to between the discharging terminal (virtual ground, VGND) and the ground via the first end and the second end, respectively. A first signal terminal and a second signal terminal are used to receive a sleep signal and the "X" state signal to reduce the leakage current under the active mode, data-retention mode or cut-off mode. And, that will reduce the leakage current without damaging the performance in the active mode.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DESCRIPTION OF THE PREFERRED EMBODIMENT

Figure 1:
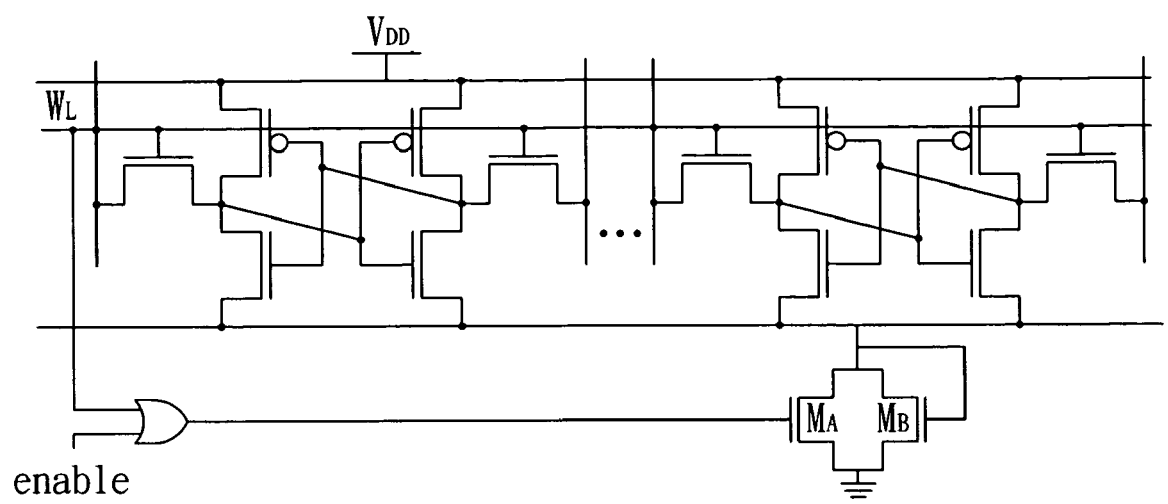
FIG. 1 is a schematic diagram showing the circuit of a conventional data-retention power gating technique.
Figure 2:
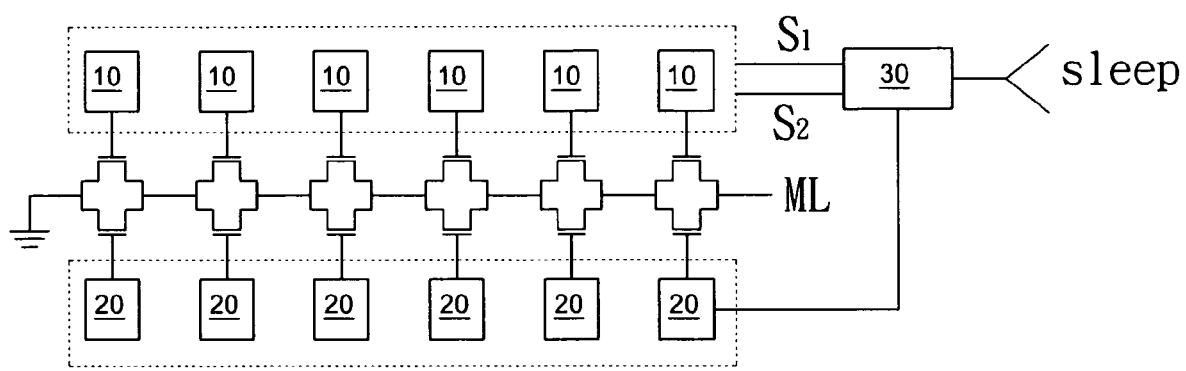
FIG. 2 is a schematic diagram showing the circuit of a TCAM segment according to one embodiment of the present invention.

Please refer to FIG. 2, which shows a segment of a TCAM according to one embodiment of the present invention. In general, the TCAM is divided into several segments, and the quantity of the bits in a segment depends on the demand. Each bit contains a pair of memory cells, called memory cell pair. In this embodiment, the segment contains an array of 6 memory cell pairs and each memory cell pair contains a storage cell 10 and a don't-care cell 20, wherein the storage cell 10 and the don't-care cell 20 are connected to the Match Line (ML) via NMOSs. The storage cell 10 is connected to a multi-mode data retention power gating device 30, and the multi-mode data retention power gating device 30 is used to connect with the don't-care cell 20 and to receive a sleep signal, also called switching control (denoted sleep signal). The first signal $S_1$ is a voltage signal with a reverse phase with respect to the sleep.

Figure 3:
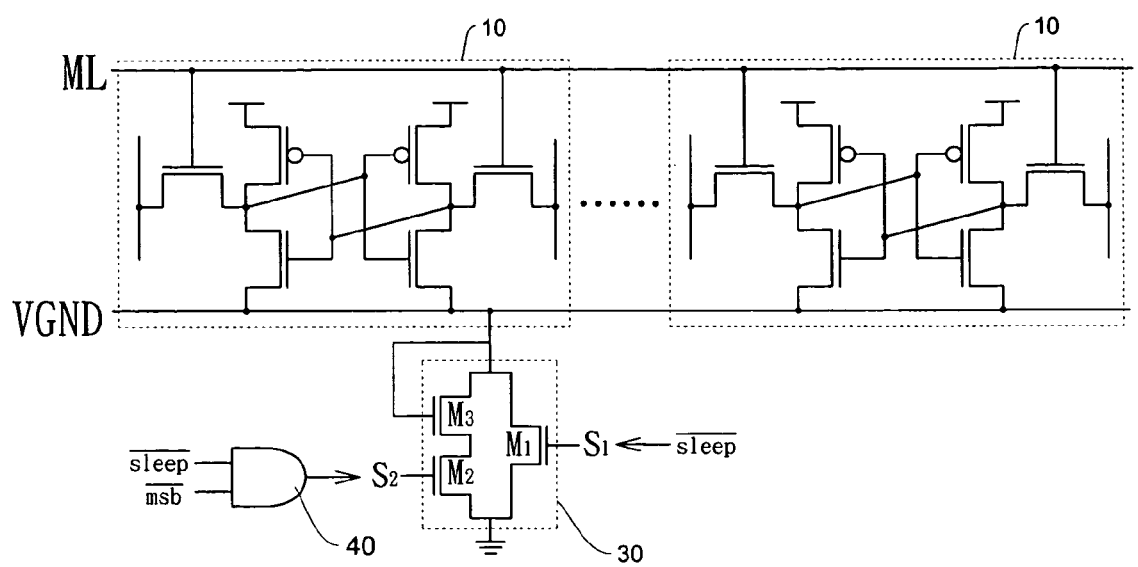
FIG. 3 is a schematic diagram showing the circuit of a multi-mode data retention power gating device according to one embodiment of the present invention.

Please refer to FIG. 3, which shows a multi-mode data retention power gating device 30 according to one embodiment of the present invention. As shown, the multi-mode data retention power gating device 30 has a first end and a second end connected to the discharging terminal of the storage cell and the ground, where the discharging terminal and the virtual ground (denoted VGND) of the storage memory cell are connected. A first signal terminal of the TCAM receives a first signal $S_1$ and a second signal terminal receives a second signal $S_2$ that is determined by the first signal $S_1$ and the value recorded in the don't-care cells of the TCAM. The sleep signal and the recorded value are marked as "sleep" and "msb" in FIG. 3, and $\overline{\text{sleep}}$ and $\overline{\text{msb}}$ represent respectively their reverse signals.

As shown in FIG. 3, for the first NMOS $M_1$, the drain electrode serves as a first end, the source electrode as a second end, and the gate electrode as a first signal terminal. For the second NMOS $M_2$, the source electrode is coupled to the source electrode of the first NMOS $M_1$, and the gate electrode serves as a second signal terminal. A diode, a diode-connected NMOS or a diode-connected PMOS is connected between the drain electrode of the second NMOS $M_2$ and the drain electrode of the first NMOS $M_1$. In this embodiment shown in FIG. 3, a diode-connected NMOS $M_3$ is employed, which is marked as $M_3$ in the figure.

For the false sleep (sleep=0), the first signal $S_1$ and the second signal $S_2$ are true ($\overline{\text{sleep}}$=1, $S_2$=1), and that is defined as the active mode, and the technique can not be applied. In this embodiment, the OR gate 40 is employed to make $S_2$=1 in this embodiment.

For the true sleep signal (sleep=1), the first signal $S_1$ is false ($\overline{\text{sleep}}$=0), and the value of $S_2$ is decided by the recorded value of the don't-care cell, msb. When non-X state, the recorded value is false (msb=0) and $S_2=1(\overline{msb}=1)$, and this mode is called a data-retention mode. When X state, the recorded value is true (msb=1) and $S_2=0(\overline{msb}=0)$, and this mode is called a cut-off mode. That is summarized in Table 1 to illustrate the suitable operations with sleep=1.

TABLE 1

| sleep | msb | $S_1$ | $S_2$ |
|---|---|---|---|
| 0 | 0 | 1 | 1 |
| 0 | 1 | 1 | 1 |
| 1 | 0 | 0 | 1 |
| 1 | 1 | 0 | 0 |

The truth value table of the multi-mode data retention power gating device 30 is shown in Table 2.

TABLE 2

| mode | $S_1$ | $S_2$ |
|---|---|---|
| active | 1 | 1 |
| data-retention | 0 | 1 |
| cut-off | 0 | 0 |

Under the active mode, the first signal $S_1$ and the second signal $S_2$ are true, as the result the first NMOS $M_1$ and the second NMOS $M_2$ are turned on to reach the full speed operation. The voltage on VGND is equal to the ground voltage, so it is identical to be connected to the ground for the TCAM.

Under the data-retention mode, the first signal $S_1$ is false and the second signal $S_2$ is true, as the result the first NMOS $M_1$ is turned off and the second NMOS $M_2$ is turned on. The leakage current charges the VGND to a saturated potential via the third NMOS $M_3$ to shrink the voltage difference between the voltages of the charging terminal and the discharging terminal, and therefore the leakage current is reduced.

Under the cut-off mode, the first signal $S_1$ and the second signal $S_2$ are false, as the result the first NMOS $M_1$ and the second NMOS $M_2$ are turned off. The leakage current reduces to the minimum due to the floating discharging terminal of the memory storage cell.

Finally, the suitable operations can be found out and marked sleep=1 in Table 3, which lists the relationship of the different operations or mode and the recorded values of the don't-care cells in a TCAM segment, msb, lsb, wherein lsb represents the storage value of the first don't-care cell in a TCAM segment and msb the last.

TABLE 3

|  | msb = lsb = 0 | msb ≠ lsb | msb = lsb = 1 |
|---|---|---|---|
| write | sleep = 0 | sleep = 0 | sleep = 0 |
| read | sleep = 1 | sleep = 0 | sleep = 1 |
| search | sleep = 1 | sleep = 0 | sleep = 1 |
| standby mode | sleep = 1 | sleep = 0 | sleep = 1 |

To sum up, the multi-mode data retention power gating device uses the first signal and the second signal to conduct the storage cells in a TCAM segment for active mode, to express the leakage current by shrinking the voltage through the storage cell for data-retention mode, or to turn off the conduction by disconnecting the storage cell to the ground for cut-off mode.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A leakage current cut-off device for a ternary content addressable memory (TCAM) utilizing a multi-mode data retention power gating device to turn on/off the connection between a discharging terminal of a storage cell of the TCAM and the ground or providing the discharging terminal with a VGND voltage, wherein the multi-mode data retention power gating device comprises:
   a first end connected to the discharging terminal of the storage cell,
   a second end connected to the ground,
   a first signal terminal and a second signal terminal, wherein the first signal terminal and the second signal terminal are used to receive a first signal and a second signal, respectively, to turn on/off the conduction between the discharging terminal of the storage cell and the ground or provide the discharging terminal of the storage cell with the VGND voltage, and
   an OR gate, wherein a first input terminal and a second input terminal of the OR gate receive the first signal and a recorded value of the storage cell, respectively, and an output terminal of the OR gate provides the second signal.

2. The leakage current cut-off device for a TCAM according to claim 1, wherein the multi-mode data retention power gating device comprises a first n-channel metal oxide silicon field effect transistor (NMOS), a second NMOS and a third NMOS, and the drain electrode and the source electrode of the first NMOS respectively serve as the first end and the second end, the source electrode of the second NMOS is coupled to the source electrode of the first NMOS, and the drain electrode and the gate electrode of the third N MOS are coupled and connected to the drain electrode of the first NMOS, and the source electrode of the third NMOS is connected to the drain electrode of the second NMOS, and the gate electrode of the first NMOS and the gate electrode of the second NMOS respectively serve as the first signal terminal the second signal terminal.

3. The leakage current cut-off device for a TCAM according to claim 1, wherein the multi-mode data retention power gating device comprises a p-channel metal oxide silicon field effect transistor (PMOS), a first NMOS and a second NMOS, and the drain electrode and the source electrode of the first NMOS respectively serve as the first end and the second end, and the source electrode of the second NMOS is coupled to the source electrode of the first NMOS, and the source electrode of the PMOS is connected to the drain electrode of the first NMOS, and the drain electrode and the gate electrode of the PMOS are coupled and connected to the drain electrode of the second NMOS, and the gate electrode of the first NMOS and the gate electrode of the second NMOS field effect transistor respectively serve as the first signal terminal the second signal terminal.

4. The leakage current cut-off device for a TCAM according to claim 1, wherein the multi-mode data retention power gating device comprises a diode, a first NMOS and a second NMOS, and the drain electrode and the source electrode of the first NMOS respectively serve as the first end and the second end, and the source electrode of the second NMOS is coupled to the source electrode of the first NMOS, and the anode of the diode is connected to the drain electrode of the first NMOS and the cathode of the diode is connected to the drain electrode of the second NMOS.

* * * * *